United States Patent

Sichmann et al.

[11] Patent Number: 5,863,328
[45] Date of Patent: Jan. 26, 1999

[54] DEVICE FOR SURFACE COATING OR LACQUERING OF SUBSTRATES

[75] Inventors: Eggo Sichmann; Reinhard Gerigk, both of Geinhausen, Germany

[73] Assignee: Singulus Technologies GmbH, Alzenau, Germany

[21] Appl. No.: 801,585

[22] Filed: Feb. 18, 1997

[30] Foreign Application Priority Data

Feb. 15, 1996 [DE] Germany .................. 196 05 601.2

[51] Int. Cl.[6] .................................................. B05C 5/00
[52] U.S. Cl. .............. 118/52; 118/56; 118/319; 118/321; 118/323; 118/500
[58] Field of Search ................. 118/52, 56, 319, 118/321, 323, 500; 239/236, 225.1, 264

[56] References Cited

U.S. PATENT DOCUMENTS

| | | | |
|---|---|---|---|
| 5,260,174 | 11/1993 | Nakazawa et al. | 118/323 |
| 5,417,763 | 5/1995 | Diepens | 118/323 |
| 5,514,215 | 5/1996 | Takamatsu et al. | 118/319 |
| 5,656,085 | 8/1997 | Hezel | 118/323 |

FOREIGN PATENT DOCUMENTS

| | | | |
|---|---|---|---|
| 3-69110 | 3/1991 | Japan | 118/52 |
| 3-129826 | 6/1991 | Japan | 118/52 |

Primary Examiner—Laura Edwards
Attorney, Agent, or Firm—Pillsbury Madison & Sutro

[57] ABSTRACT

Apparatus for surface coating or for lacquering of a substrate, such as a disk-shaped substrate 2, which can be placed on a substrate support 14 and can be driven or made to perform a rotating movement, wherein the medium to be applied or the lacquer fluid is applied to the substrate 2 via a feed device 6 which can be displaced in relation to the substrate 2 and/or can be driven. The substrate 2 or the substrate support 14 can be displaced by means of a guide device or in a connecting link guide 7 in such a way that in the area of the substrate 2 the feed device 6 for applying the fluid or the lacquer is conducted approximately parallel with the surface of the substrate 2 and can be stopped at any arbitrary point above the substrate 2 at an even height distance.

17 Claims, 4 Drawing Sheets

DEVICE FOR SURFACE COATING OR LACQUERING OF SUBSTRATES

BACKGROUND OF THE INVENTION

The invention relates to an apparatus for surface coating or lacquering of substrates or disk-shaped substrates, such as a disk-shaped information carrier, which can be placed on a substrate support and can be driven or made to perform a rotating movement via a drive device, wherein the coating substance or lacquer to be applied is applied to the substrate via a feed device and an associated nozzle which can be displaced in relation to the substrate and/or can be driven.

A feed device for the application of lacquer to surfaces of substrates which is guided in a support device, so that the lacquer can be delivered by means of a nozzle to the surface of the substrate is already generally known. A perfect lacquer application is not assured with such an arrangement, since the distance between the nozzle and the top of the substrate changes in various positions of the feed device. The thickness of the lacquer application can also be disadvantageously affected by this.

SUMMARY OF THE INVENTION

It is accordingly an object of the invention to provide an improved apparatus for lacquering substrates, by means of which an even lacquer application to the entire surface of the substrate is assured.

This object is attained in accordance with the invention in that the substrate or the substrate support has a guide device or a connecting link guide which contains a first guide element and a second guide element which are at different distances from the base of the device. The feed device with its associated nozzle can be guided exactly along and parallel with the surface of the substrate by using a connecting link guide, so that a constant distance between the outlet opening of the nozzle and the surface of the substrate is created at any arbitrary place on the substrate. An even lacquer application is thus assured.

To this end, it is advantageous that the feed device is connected with the drive device and is received by a support device, and that the feed device can be displaced in the horizontal direction and/or the vertical direction by means of the guide device.

In accordance with a further feature of the invention, a further option is that the drive device is operatively connected with a stepping motor, such as an electrical or electro-hydraulic stepping motor, and that the drive device has a stepping motor, which is operatively connected with the guide device by means of a gear or a toothed rack or worm gear. It is possible to perform a digital triggering of the stepping motor, because of the capabilities of a stepping motor, and thus an exact positioning of the nozzle above the substrate, so that any arbitrary surface, i.e. a small or a large coating surface, can be provided with lacquer, and an even lacquer thickness is also achieved over the entire surface, since the nozzle is guided parallel with the surface of the substrate and is stopped exactly at any desired preset spot.

In further accordance with the invention, it is advantageous that the drive device is disposed in a support arm or is associated with it, in which the connecting link guide is provided and which is formed of a first horizontal element, an inclined extending element adjoining the first horizontal element, and a second horizontal element adjoining the second horizontal element, in which slide elements or roller bearings are provided or move, wherein besides the first connecting link guide, a second connecting link guide can be provided, which extends parallel with the first and/or second element, and that a supply line is received in the feed device for conveying the fluid or the lacquer, which can be displaced together with the feed device.

In accordance with a preferred embodiment of the invention, it is finally provided that the step motor cooperates with a sensor in an end position, from where the position of the feed device and the step motor can be preselected and displaced into any arbitrary position above the substrate, and that the substrate, which can be supplied with lacquer by means of the feed device, can be placed on a substrate support, which is equipped with a circular or cylindrical guide device which surrounds the substrate holder.

It is furthermore advantageous that the guide device consists of two guide surfaces or guide elements, which are in the form of truncated cones and rest against each other, via which the lacquer can be supplied to a first reservoir, and that the first guide device is surrounded by a second circular or cylindrical guide device.

According to a further feature of the invention, it is advantageous that the first and second circular or cylindrical guide devices respectively have an opening each, wherein the first opening is an outflow opening for lacquer and the second an opening for aspirating lacquer mist, and that a coaxially disposed element of the second guide device is equipped with a centrally disposed bore.

It is furthermore advantageous that the substrate support is coaxially surrounded by both guide devices, and that the substrate support is supported by at least one guide device or by the inner guide device.

Manual readjustment is therefore no longer necessary because of the capabilities of devices in accordance with the invention, so that the stepping motor can bring the nozzle to any arbitrary place where the lacquer application is to begin, even when the installation is running. It is not necessary to switch off the entire installation for the adjustment process of the nozzle, and the recipient cover need not be lifted in order to perform manual adjustment. By means of the program control in accordance with the invention, it is possible to enter different substrate diameters into a control device, which then stops the step motor when the lacquering nozzle has reached the selected position. An interruption of production is not necessary for manual readjustment of the adjustment path of the nozzle.

Further advantages and details of the invention are defined in the claims and the following specification together with the accompanying drawings.

DESCRIPTION OF THE PREFERRED EMBODIMENTS

Figure 1:
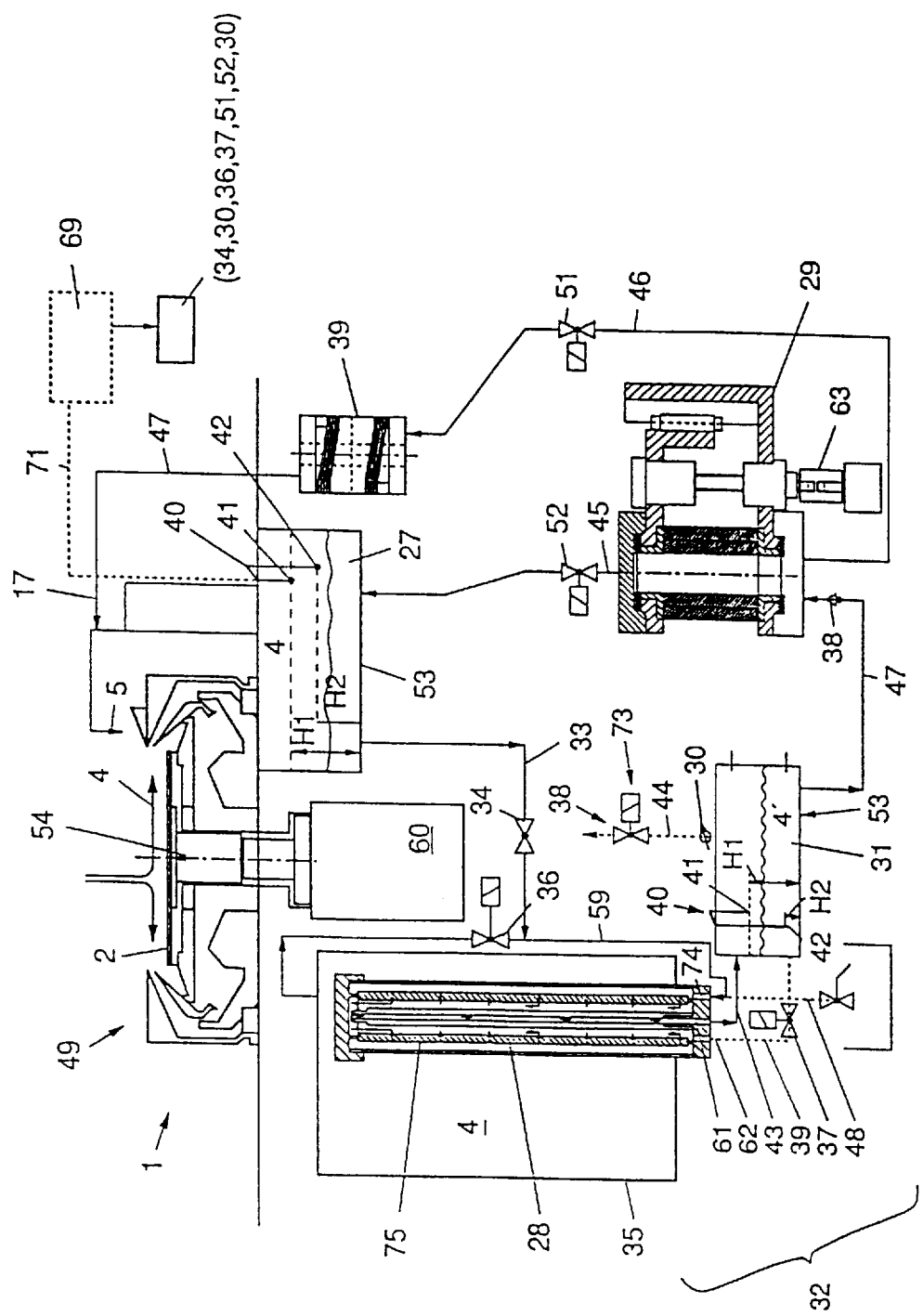
FIG. 1 is a schematic representation of an embodiment of a complete device for lacquering of substrates or compact disks (CDS) according to the invention.
Figure 2:
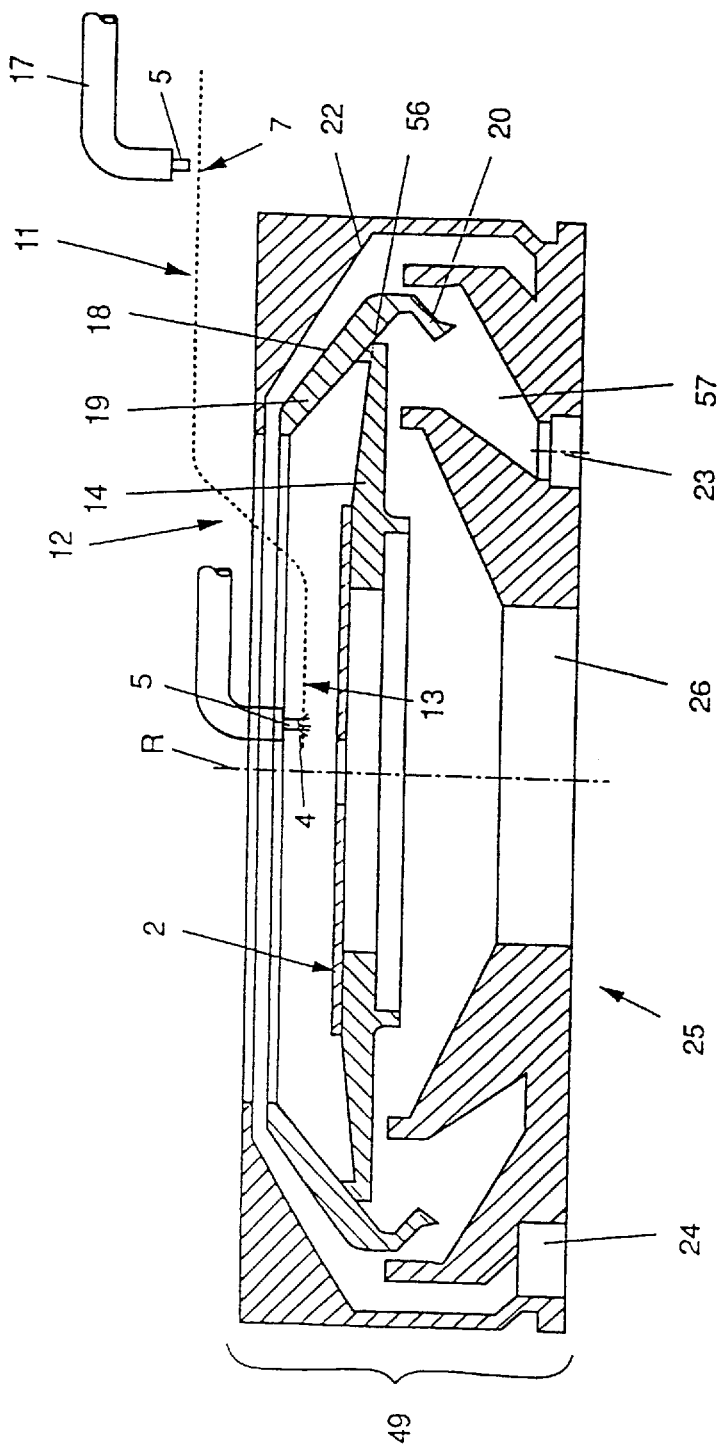
FIG. 2 is an elevational cross-sectional view of a lacquering head according to the invention with an associated guide device for catching spun-off lacquer and for drawing off lacquer mist.

One embodiment of a complete device 1 according to the invention for surface coating or lacquering substrates 2, part of which is a lacquering head 49, is shown in FIG. 1. Lacquering head 49 is shown in more detail in FIG. 2, As shown in FIGS. 1 and 2, the lacquering head 49 is drivingly connected with a drive motor 60 via a shaft 54.

The lacquering head 49 has a guide device 18, consisting of two guide elements 19, 20 which are each in the shape of a truncated pyramid, or cone, rest against each other and are firmly connected with each other, as well as being firmly connected via bars 56, which have openings, with a substrate support or plate 14. The upper part of the guide element 19 of the guide device 18 extends in an inclined manner in relation to the central longitudinal axis R of lacquering head 49 and tapers upwardly in the form of a pyramid. As already mentioned, the lower guide element 20 follows the guide element 19 and tapers downwardly in the direction toward the center axis R. The guide element 18 terminates in an annular circuit 57 which itself terminates through a line, as shown in FIG. 1, in a first collecting reservoir 27.

Figure 3:
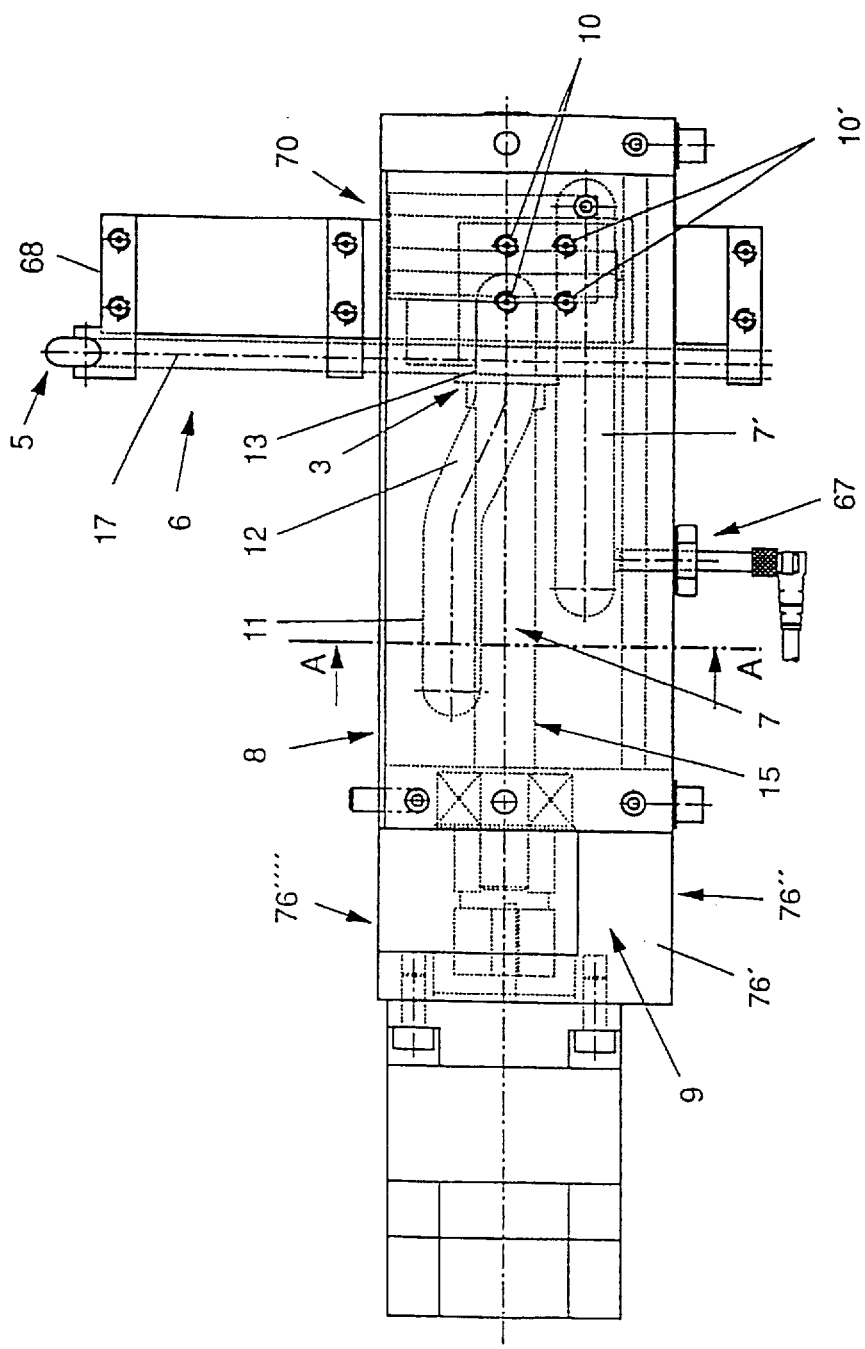
FIG. 3 is a side elevational view of a feed device according to the invention with a nozzle which can be displaced in the horizontal and vertical directions by means of a connecting link guide.
Figure 4:
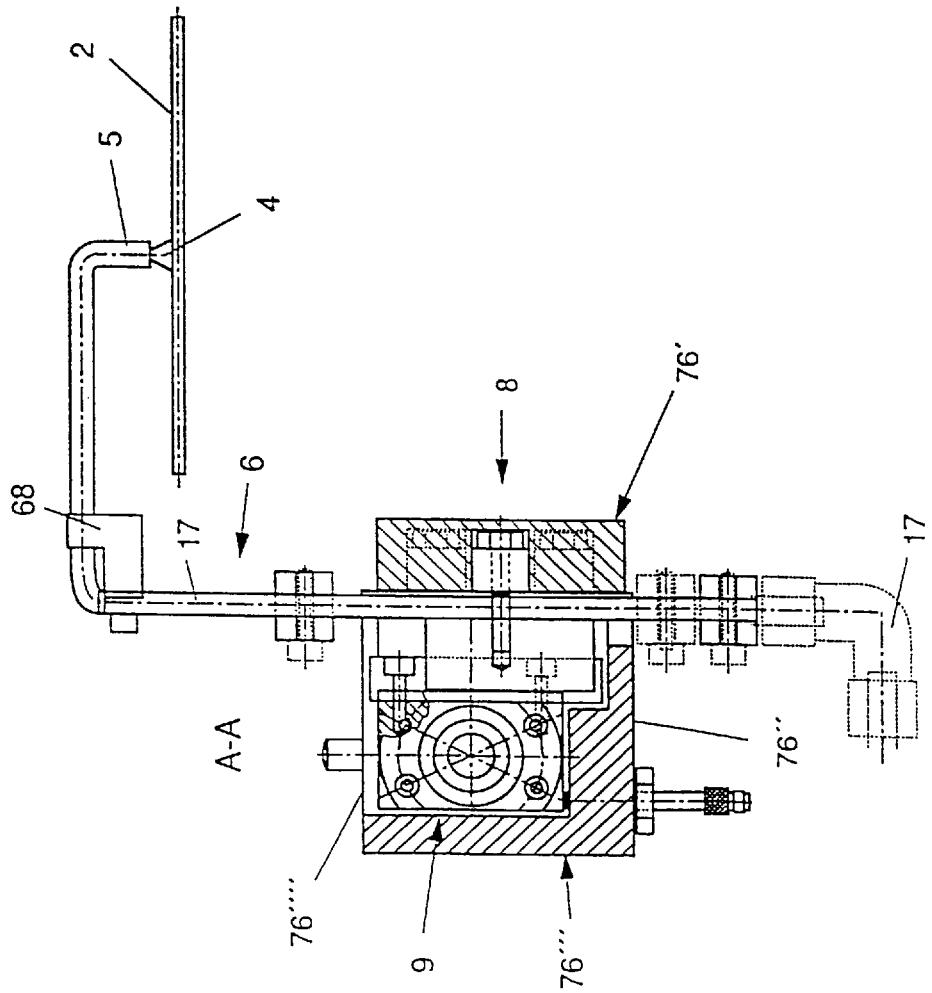
FIG. 4 is a cross-sectional view taken along the line A—A of FIG. 3.

A fluid, for example lacquer 4, reaches the substrate 2 via a feed device 6, as can be seen from FIGS. 3 and 4, and an associated nozzle 5, while the substrate 2 is given a rotating movement by the motor 60. In this process, the lacquer 4 flows radially outwardly on the surface of the substrate 2 due to centrifugal forces and reaches the annular conduit 57 via the edge of the substrate 2 and the guide device 18. Further excess lacquer particles are spun off the surface of the substrate 2 in the form of a lacquer mist. These lacquer particles are suctioned off by a second guide device 22, which is circularly shaped, adjoins the outer contour of the guide element 19 and has a suction opening 24 in its lower area, so that lacquer particles caught by means of the guide device 22 can also be sent to the first collecting reservoir 27. The spun-off lacquer fluid reaches the first collecting reservoir 27 via the lacquering head 49 or the associated guide elements 19, 20 and the associated flow-off openings 23. The first collecting reservoir 27 is connected via a fluid line 33, which is embodied as a return flow line, and via a first control valve 34 to a fluid line 59, which is connected with its upper end to the upper end of a collecting tank 35, and with its lower end with an inlet opening 74 of a filter 28. In the illustrated embodiment, filter 28 is housed in tank 35.

A second valve 36 is located in the line 59, through which the tank 35 can be connected via the line 59 with the inlet opening 74 of the filter 28 when it is intended to conduct lacquer fluid 4 from the tank 35 via the filter 28 to a second collecting reservoir 31. To this end, the outlet opening 61 of the filter 28 is connected via a line 43 to the upper end of the second collecting reservoir 31. The lower end of the second collecting reservoir 31 is furthermore connected via a valve 37 and a line 39 with a second inlet opening 62 of the filter 28, so that the filtered fluid remaining in the filter can run off into the second collecting reservoir 31 when the fluid filter cartridge of the filter 28 is to be replaced. The filter 28 is equipped with a centrally disposed pipe 75 which is to assure that the fluid flows to the upper end of the pipe 75 so that the filter cartridge is always completely immersed in fluid.

From the first collecting reservoir 31, the lacquer fluid 4' reaches a pump, which can be embodied as a metering pump 29, via a line 47 and a valve 38'. The pump 29 is driven by a stepping motor 63, so that with an appropriate control pulse it is possible to feed lacquer fluid from the collecting reservoir 31 via the metering pump 29 as well via as a line 46, a control valve 51, an electric heater 89 and the line 47, to the lacquering head 49.

The pump or metering pump 29 furthermore is connected via a line 45 and a control valve 52 with the first collecting reservoir 27. So that the pump or diaphragm pump 29 can operate correctly, a flap valve 38 is provided under the metering pump 29. The flap valve 38 assures that the lacquer fluid 4' is conveyed only from the second collecting reservoir 31 to the first collecting reservoir 27.

So that a correct supply of the two lacquer reservoirs or collecting reservoirs 27 or 31 with lacquer fluid is assured, the entire apparatus 1 has one or two fill level indicator devices 40, each connected via an electric line 71 with an evaluating, or control and regulating, unit 69, by means of which the individual valves or electrically or pneumatically operable valves 34, 36, 37, 51, 52 as well as pump 30 can be triggered in order to conduct the lacquer fluid in the desired direction or to the individual collecting reservoirs 27, 31 and the substrate 2.

In accordance with FIG. 1, each fill level indicator 40 consists, among others, of two sensors 41, 42 disposed next to each other at a distance, and each fill level indicator 40 is housed in a respective one of the upper, or first, collecting reservoir 27 and the lower, or second, collecting reservoir 31. The first sensor 41 has a height H1 and the second sensor a height H2 in respect to a bottom 53 of the respective collecting reservoir. Height H1 is here higher than height H2.

The two measuring points of the two sensors 41 and 42 of each fill level indicator 40 can be wet by lacquer. The sensors 41, 42 are supplied with d.c. voltage, wherein the resistance value between each sensor and the housing is measured. The different fill levels in the collecting reservoirs 27 or 31 affect the resistance values. The signal evaluation of the measured values of the two sensors 41, 42 can be recalibrated at any time when the fluid introduced into the collecting reservoirs 27, 31 wets the two measuring points.

The sensors 41, 42 and the collecting reservoir 27, 31 are connected via respective electrical lines 71 to the evaluating unit 69, which detects the measured values by means of the sensors 41 and 42 and uses the measured values determined in this way as control values for triggering the individual valves, for example in order to provide the two collecting reservoirs 27 and 31 with fluid and to close the control valve 34 to the filter 28 at a defined degree of dirt accumulation.

In the course of the filling process of the fluid or the lacquer 4 into a collecting reservoir, it is possible in an empirical manner to determine a so-called background curve or measuring curve (resistance vs. fill level), so that this curve is available later as a relative reference value during the height measurement of the fluid in the collection reservoir. Since during prolonged employment of the circulating lacquer fluid it is possible that the moisture content in the lacquer can change, it is important that a continuous calibration of the resistor elements or sensors is performed. Following such calibration it is also possible to determine respectively the actual value of the fill level in the collecting reservoir 27 and/or 31 by means of only one sensor, for example the sensor 42. The measuring points or measured resistance values of the respective fill level determined in this manner inform the operators when, for example, the lower collecting reservoir 31 is to be supplied again with new lacquer via the tank 35, or with used lacquer via the upper collecting reservoir 27. Because of this there is the possibility that the operator can, for example, set a freely selectable maximum fill level in the lacquer tank before lacquer from the upper reservoir 27 or from the tank 35 is refilled. To this end the valve 36 of the tank 35 is opened via the control unit 69, and the lacquer fluid can then be conducted via the line 59 and the inlet opening 74 to the filter 28, from where the cleaned lacquer fluid is then filled in the upper area of the collecting reservoir 31 via the outlet opening 61 and the line 43. The cleaned lacquer fluid is provided to the second collecting reservoir 31 in this manner.

The time for a filter replacement can also be detected by means of the sensors 41, 42. Since the return speed of the cleaned fluid from the filter 28 can be determined when the fill levels of the two collecting reservoirs 27 and 31 are known, the amount of the return flow can also be a value for triggering the valves 34, 36, which must be closed when it is necessary to replace the filter 28 when it is too full of dirt. Also, the collecting reservoir 31 is no longer replenished as quickly because of the reduced amount of return flow, so that this time factor, together with the fill level in the collecting reservoir 31, represents a regulated variable by means of which the described filter replacement makes sense, as already mentioned.

The upper collecting reservoir 27 is also intended in an advantageous manner to have only a minimal amount of lacquer fluid, so that only little lacquer fluid is continuously recirculated in the total installation. By means of this it is assured that no aging process occurs in the lacquer fluid, since after a relatively short time the lacquer is used up for the greatest part before unused lacquer is conducted from the tank 35 into the collecting reservoir 31. To this end the control valve 36 is opened under control of the evaluation or control unit 69, and the lacquer flows via the filter 28 into the collecting reservoir 31 until the desired maximum fill level has been achieved and the sensor 41 is brought into contact with fluid for automatic calibration. After this time the control valve 34 or 36 is automatically returned into the closed position.

By means of the advantageous arrangement of the two sensors 41, 42 arranged respectively in one collecting reservoir it is possible to continuously determine measured values or measured resistance values and to pass them on to the described evaluation unit 69, so that then, depending on the mode of operation, the individual valves 34, 36, 37, 51 and 52 and pump 30 can be triggered simultaneously or offset from each other in time in order to supply the feed device 6, and thus also the already described collecting reservoirs 27, 31, with lacquer fluid in good time in this way.

The two sensors 41, 42 can be embodied as resistance measuring sensors.

It is furthermore possible to provide a sensor for the lacquer temperature in the area of the heater 89, so that it is possible by means of this to trigger the heater 89 accordingly.

If, for example, the lower collecting reservoir 31 is not appropriately filled, a corresponding measured variable is transmitted via the lower sensor 42 to the evaluation unit 69, by means of which it is then possible to open the control valve 34 or 36.

An exemplary embodiment of the feed device 6 for applying the fluid or the lacquer 4 in the area of the lacquering head 49 or the substrate 2 is shown in FIGS. 3 and 4. The feed device 6 consists of a support device 8 extending horizontally in accordance with FIGS. 3 and 4, which is disposed on a holder or a housing not represented in the drawings. The holder 8 has an approximately box-shaped housing formed from the lateral elements 76' to 76'", in which a drive device 3 with a stepping motor 9 for driving a gear or toothed rack or helical worm gear 15 is provided. Via the gear 15, the stepping motor 9 therefore drives the feed device 6 horizontally in FIG. 3, so that it can be displaced parallel with the surface of the substrate 2. The feed device further includes a sensor 67 which cooperates with the stepping motor 9 to define an end position of displacement of the feed device, from which position the feed device can be selectively displaced into any arbitrary position above the substrate.

The support device 8 consists of a part which extends vertically in relation to a support arm, with a holder 68 provided at the upper end for receiving a supply line 17, to whose upper end the nozzle 5 is connected, so that it is possible to deliver the lacquer 4 to the substrate 2 by means of nozzle 5. The supply line 17 is connected to the lower collecting reservoir 31 via the lines 47, the heater 89, the line 46 and the pump 29.

As can be seen in particular from FIG. 3, the feed device 6 can be displaced in the support device 8 between an extreme right position and an extreme left position in the horizontal direction and vertical height.

So that the horizontal and vertical displacement of the feed device 6 is possible, the support device 8 has a first connecting link guide, or slot, 7 which is formed by a horizontally extending element 11, an inclined element 12 adjoining it, and an again adjoining, also horizontally extending, element 13, which are used for receiving sliding elements or roller bearings 10. As indicated in FIG. 2, the raised position associated with element 11 allows nozzle 5 to move past the upper edge of lacquer head 49, while the lowered position associated with element 13 allows nozzle 5 ro be at the proper height for applying lacquer to substrate 2. If the feed device 6 is in the position shown in FIG. 3, it has taken up its lower position, or the position in which the nozzle 5 can deliver lacquer to the substrate 2. The lacquer application by means of the nozzle 5 starts at the inner diameter of the substrate 2, so that by means of the rotating movement of the substrate support 14 the medium, or the lacquer, delivered to the substrate 2 by means of the nozzle 5, is evenly outwardly distributed and the remainder is caught by means of the lacquer head 49. In an advantageous manner the horizontally extending element 11 of the connecting link guide 7 is here as long as the corresponding lacquering radius of various substrate shapes, so that there is the option of coating a substrate of any diameter with lacquer without the distance between the lower end of the nozzle 5 and the surface of the substrate 2 being changed when the feed device 6 is displaced. It is possible in this way to keep the vertical travel distance, or drop height, of the lacquer exiting the nozzle 5 constant and it can be assured that an even lacquer application is provided.

The lower, horizontally extending element 13 of the connecting link guide 7 therefore also assures that by means of the step motor 9 the exact positioning of the nozzle 5 in any arbitrary position above the substrate 2 is possible, regardless at which place the lacquer application to the surface of the substrate 2 is intended. If the feed device 6 is moved over the inclined extending element 12 to the horizontally extending element 11, the supply device 6 first performs a horizontal movement, then a combined horizontal and vertical movement, and subsequently again a horizontal movement. The reference position is determined during this adjustment process by means of a sensor.

In the slide elements or roller bearings 10 received in the first connecting link guide 7 and connected with the feed device 6, it is possible to provide two further roller bearings 10' arranged at a distance from the first roller bearings 10, which are received in a further connecting link guide 7'. The connecting link guide 7' extends parallel with the elements 11, 13 of the connecting link guide 7 and assures that tilting of the feed device 6 is prevented. Thus, if the step motor 9 is driven, the feed device 6 is moved either to the right or the left via a spindle and an associated connecting link or nut 70.

Roller bearings 10 and 10' are mounted on shafts or pins fixed to feed device 6.

So that damage to the supply line 17 is impossible, it is conducted through appropriate bores or a free space in the feed device 6.

Since all essential components, in particular the drive device 3, a large portion of the feed device 6 as well as the supply line 17 are housed in the support device 8, they are not only protected against damage, but also from being soiled by lacquer.

As can be seen in particular in FIG. 1, it is possible as already described, to deliver the fluid medium or the lacquer 4 delivered from the substrate support 14 via guide elements 19, 20 at least to the first collecting reservoir 27, which is connected with at least one filter 28, from which the fluid is conducted indirectly or directly via a pump 29 to the first collecting reservoir 27, wherein it is possible to set an underpressure between the first outflow line 33 of the first collecting reservoir 27 and the pump 29 by means of a pump 30, which is embodied as a Venturi nozzle.

The vacuum pump 30 is connected to a return flow device 32 consisting of the lines 33, 39, 48 and 59, the filter 28 and valve 80. The vacuum pump 30 is connected via a line 44 with the second collecting reservoir 31. The fluid or the fluid lacquer medium spun off the substrate support 14 is conducted via the first collecting reservoir 27 to the first filter 28, wherein in the installation the return flow device 32 is connected to the underpressure installation of the line 44, by which the underpressure is generated. Valve 38 can be replaced by a Venturi tube. Because of this it is possible to move even fluid medium or lacquer of high viscosity through the filter installation and to achieve the desired purity of the fluid and an interference-free conveying operation. Because of the vacuum operation it is also possible to employ filters 28 with very close-meshed filter elements without the run-through time of the lacquer in the entire installation being disadvantageously reduced. Because of the advantageous employment of the underpressure operation, such filters 28 can also remain in service considerably longer, since besides the pump 29 in connection with the underpressure a high flow-through speed of the lacquer fluid is assured.

In the exemplary embodiment the Venturi tube or the vacuum pump 30 is connected to the collecting reservoir 31. However, the vacuum pump 30 can also be connected at any other suitable place between the first collecting reservoir 27 and the pump or metering pump 29. The metering pump 29 can be switched into the return flow device 32 via a regulating valve 37.

This application relates to subject matter disclosed in German application number 196 05 601.2, filed on Feb. 15, 1996, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. Apparatus for coating a substrate with a coating substance, comprising:
   a feed device connected for delivering the coating substance to the substrate;
   a substrate support for supporting and rotating the substrate while coating substance is delivered to the substrate by said feed device;
   a drive device connected for effecting relative movement between said feed device and said substrate support;
   guide means connected to said feed device for guiding the relative movement between said feed device and said substrate support, said guide means comprising a first guide member having first and second horizontally extending guide elements which are located at respectively different elevations and an inclined guide element which extends between said first and second guide elements in a direction that is inclined to said first and second guide elements; and
   support means for supporting said drive device, wherein said drive device is disposed in said support means, and said guide means further comprise:
      bearing members movably connecting said guide means and said feed device; and a second guide member which extends parallel to said first and second guide elements.

2. Apparatus in accordance with claim 1, wherein said guide means define a path having components which are parallel to and perpendicular to the substrate.

3. Apparatus in accordance with claim 1, wherein said drive device comprises a stepping motor.

4. Apparatus in accordance with claim 3, wherein said drive device further comprises transmission means which couple said stepping motor to said guide means.

5. Apparatus in accordance with claim 1, further comprising a supply line (17) coupled to said feed device for delivering coating substance to said feed device, said supply line being displaceable together with said feed device.

6. Apparatus in accordance with claim 1, wherein said drive device comprises a stepping motor (9) and a sensor (67) which cooperates with said stepping motor to define an end position of displacement of said feed device, from which position said feed device can be selectively displaced into any arbitrary position above the substrate.

7. Apparatus in accordance with claim 1, further comprising a circular- or cylindrical-shaped first guide device (18) surrounding said substrate support.

8. Apparatus in accordance with claim 7, further comprising a first collecting reservoir, and wherein said first guide device comprises two guide elements (19, 20), each in the form of a truncated cone, which are contiguous with one another, said guide elements delimiting a flow path for conducting excess coating substance from the substrate to said first collecting reservoir.

9. Apparatus in accordance with claim 8, further comprising a circular- or cylindrical-shaped second guide device (22) surrounding said first guide device.

10. Apparatus in accordance with claim 9, wherein each of said first and second guide devices has a respective outflow opening (23, 24), wherein said outflow opening of said first guide device is an outlet opening for coating substance in liquid form and said outflow opening of said second guide device is an aspirating opening for a mist containing coating substance.

11. Apparatus in accordance with claim 10, wherein said second guide device has a coaxially arranged portion (25) provided with a centrally disposed bore (26).

12. Apparatus in accordance with claim 9, wherein the substrate support is coaxially surrounded by both said first and second guide devices.

13. Apparatus in accordance with claim 9, wherein the substrate support is supported by at least one of said guide devices.

14. Apparatus in accordance with claim 1, wherein said guide means are constructed to assure displacement of said feed device approximately parallel with the surface of the substrate, and said drive device is operative for stopping said feed device at any selected point above the substrate at a constant height above the substrate.

15. Apparatus in accordance with claim 1 wherein said first guide element defines a linear movement path for said feed device.

16. Apparatus for coating a substrate with a coating substance, comprising a feed device connected for delivering the coating substance to the substrate;

a substrate support for supporting and rotating the substrate while coating substance is delivered to the substrate by said feed device;

a drive device connected for effecting relative movement between said feed device and said substrate support; and guide means connected to said feed device for guiding the relative movement between said feed device and said substrate support, said guide means comprising a guide member having first and second guide elements which are located at respectively different elevations, wherein said drive device comprises a stepping motor and a sensor which cooperates with said stepping motor to define an end position of displacement of said feed device, from which position said feed device can be selectively displaced into any arbitrary position above the substrate.

17. Apparatus for coating a substrate with a coating substance, comprising:

a feed device connected for delivering the coating substance to the substrate;

a substrate support for supporting and rotating the substrate while coating substance is delivered to the substrate by said feed device;

a drive device connected for effecting relative movement between said feed device and said substrate support;

guide means connected to said feed device for guiding the relative movement between said feed device and said substrate support, said guide means comprising a first guide member having first and second guide elements which extend parallel to the substrate when the substrate is on said substrate support, and an inclined guide element which extends between said first and second guide elements in a direction that is inclined to said first and second guide elements, said first and second guide elements being located at respectively different elevations and said first guide element being disposed in a region proximate to the substrate when the substrate is on said substrate support;

a supporting arm for supporting said drive device, said first guide member being provided in said supporting arm; and bearing members movably connecting said guide means and said feed device.

* * * * *